United States Patent
Miyamoto et al.

(10) Patent No.: US 9,136,415 B2
(45) Date of Patent: Sep. 15, 2015

(54) SOLAR BATTERY CELL

(75) Inventors: Shinsuke Miyamoto, Chiyoda-ku (JP);
Masashi Nakamura, Chiyoda-ku (JP);
Teruto Miura, Chiyoda-ku (JP);
Daisuke Echizenya, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 623 days.

(21) Appl. No.: 13/202,786

(22) PCT Filed: Apr. 30, 2009

(86) PCT No.: PCT/JP2009/058493
§ 371 (c)(1),
(2), (4) Date: Aug. 23, 2011

(87) PCT Pub. No.: WO2010/125679
PCT Pub. Date: Nov. 4, 2010

(65) Prior Publication Data
US 2011/0297224 A1     Dec. 8, 2011

(51) Int. Cl.
*H01L 31/0224* (2006.01)
*H01L 31/05* (2014.01)

(52) U.S. Cl.
CPC .... *H01L 31/0504* (2013.01); *H01L 31/022433* (2013.01); *Y02E 10/50* (2013.01)

(58) Field of Classification Search
CPC ............... H01L 31/00; H01L 31/0224; H01L 31/022425; H01L 31/022433; H01L 31/05; H01L 31/0508; H01L 31/0504; H01L 31/02; H01L 31/02016; H01L 31/18

USPC ......................................................... 136/256
See application file for complete search history.

(56) References Cited

U.S. PATENT DOCUMENTS

2009/0277491 A1* 11/2009 Nakamura et al. ............ 136/244
2010/0018562 A1   1/2010 Kurahashi et al.

FOREIGN PATENT DOCUMENTS

JP      2000-188409 A     7/2000
JP      2000-261012 A     9/2000
(Continued)

OTHER PUBLICATIONS

Office Action (Notice of Rejection) dated Sep. 10, 2013, issued by the Japanese Patent Office in the corresponding Japanese Patent Application No. 2012-271681 and partial English translation thereof. (5 pages).

(Continued)

*Primary Examiner* — Christina Chern
(74) *Attorney, Agent, or Firm* — Buchanan Ingersoll & Rooney PC

(57) ABSTRACT

A solar battery cell that comprises a plurality of grid electrodes and light-receiving-surface lead connection electrodes on a light receiving surface of a semiconductor substrate, and comprises a plurality of back-surface lead connection electrodes that are connected to back-surface lead wires, formed on the second straight lines that are substantially opposite to the first straight lines while sandwiching the semiconductor substrate together with the first straight lines, on a back surface of the semiconductor substrate, wherein an edge portion of each of the light-receiving-surface lead connection electrodes is not overlapped with an edge portion of each of the back-surface lead connection electrodes in a width direction.

6 Claims, 8 Drawing Sheets

(56) References Cited

FOREIGN PATENT DOCUMENTS

| | | | |
|---|---|---|---|
| JP | 2002-43597 A | 2/2002 | |
| JP | 2006-278704 A | 10/2006 | |
| JP | 2006-278710 A | 10/2006 | |
| JP | 2006-287001 A | 10/2006 | |
| JP | 2007-266262 | 10/2007 | |
| JP | 2008-021831 A | 1/2008 | |
| JP | 2008-135655 A | 6/2008 | |
| JP | 2008-186928 A | 8/2008 | |
| JP | 2008-235354 A | 10/2008 | |
| JP | 2008-270619 A | 11/2008 | |
| JP | 2008-282990 A | 11/2008 | |
| WO | WO 2007043428 A1 * | 4/2007 | .............. H01L 31/04 |
| WO | WO 2009/019929 A | 2/2009 | |

OTHER PUBLICATIONS

Japanese Office Action (Notice of Rejection) dated Oct. 16, 2012, issued in corresponding Japanese Patent Application No. 2011-511239, and English language translation of Office Action. (6 pages).

International Search Report (PCT/ISA/210) issued on Aug. 4, 2009, by Japanese Patent Office as the International Searching Authority for International Application No. PCT/JP2009/058493.

Written Opinion (PCT/ISA/237) issued on Aug. 4, 2009, by Japanese Patent Office as the International Searching Authority for International Application No. PCT/JP2009/058493.

Japanese Notice of Rejection dated Dec. 24, 2013 issued in the corresponding Japanese Patent Application No. 2012-271681 and English translation (5 pages).

* cited by examiner

SOLAR BATTERY CELL

FIELD

The present invention relates to a solar battery cell that includes lead wires that are connected to electrodes and extract an electric output and can reduce breakage of cells after the lead wires are connected to electrodes.

BACKGROUND

A solar battery cell is connected to lead wires that are made of rectangular copper wires to extract an electric output. The lead wires contract when they are cooled from a high temperature state immediately after connection to a normal temperature. Contraction of the lead wires generates warpage or local deformation in a substrate, and becomes a cause of breakage of the solar battery cell.

On a light receiving surface (a front surface) of a substrate of the solar battery cell, lead connection electrodes that extend on straight lines are formed to connect the lead wires. Meanwhile, on a back surface of the substrate, lead connection electrodes are formed in a dot shape (intermittently) at a predetermined distance therebetween, to similarly connect the lead wires. Portions other than the dot-shaped lead connection electrodes on the back surface of the substrate are entirely formed as aluminum electrodes.

Conventionally, to relax warpage of a solar battery cell, it has been proposed that, at positions where lead connection electrodes are not present on a back surface of a substrate, lead connection electrodes are not provided similarly on a light receiving surface. In the solar battery cell having this sort of structure, warpage occurs on the substrate at portions where lead connection electrodes are not present at a side of the light receiving surface, but the warpage is relaxed by the rigidity of aluminum electrodes at the back surface side of the substrate (see, for example, Patent Literature 1).

CITATION LIST

Patent Literature

Patent Literature 1: Japanese Patent Publication No. 4174545

SUMMARY

Technical Problem

Although the structure in Patent Literature 1 mentioned above has a certain effect to relax warpage of a solar battery cell, this structure does not have a sufficient effect to prevent breakage of cells that is attributable to local deformation due to stress concentration as explained below.

Generally, when lead wires made of rectangular copper wires are connected to lead connection electrodes made of silver, because the lead wires (copper) have a larger contraction rate than that of the lead connection electrodes (silver), the lead wires apply stress to the lead connection electrodes to contract the lead connection electrodes that are formed on a solar battery cell surface. The stress that the lead wires apply to the lead connection electrodes to contract the lead connection electrodes is similarly generated in lead connection electrodes on a back surface by lead wires on the back surface. When the stress applied from the lead connection electrodes at a light receiving surface side to the substrate and the stress applied from the lead connection electrodes at a back surface side to the substrate work at the same position while sandwiching the substrate, the stress is concentrated and this concentrated stress becomes a cause of breakage of cells. In this regard, according to the structure in Patent Literature 1 mentioned above, because there is a portion where the lead connection electrodes at the light receiving surface side and the lead connection electrodes at the back surface side are overlapped while sandwiching the substrate, stress concentration occurs at this portion. Therefore, an effective improvement measure against this stress concentration has been desired.

Meanwhile, in recent years, it has been confirmed by experiments conducted by the present inventors that stress concentration also occurs at the following positions. That is, it has been made clear that if lead wires should be connected in a direction deviated to a width direction and also if the lead wires should stick out from the lead connection electrodes, large stress locally occurs at an edge portion of the lead connection electrodes. Therefore, an effective improvement measure against stress concentration that occurs in this manner has been also desired.

The present invention has been achieved in view of the above problems, and an object of the present invention is to obtain a solar battery cell that can effectively relax concentration of stress applied from lead connection electrodes of a solar battery cell to a substrate and can decrease occurrence of breakage of cells by preventing local excessive deformation.

Solution to Problem

In order to solve the aforementioned problems, and attain the aforementioned object, a solar battery cell according to one aspect of the present invention is constructed in such a manner as to include a plurality of grid electrodes that are formed in parallel and light-receiving-surface lead connection electrodes that are formed while extending on first straight lines that are substantially orthogonal to the grid electrodes and are connected to light-receiving-surface lead wires, on a light receiving surface of a semiconductor substrate, and include back-surface lead connection electrodes that are connected to back-surface lead wires, on a back surface of the semiconductor substrate, wherein the back-surface lead connection electrodes are formed in a dot shape at a predetermined distance therebetween on second straight lines that are substantially opposite to the first straight lines while sandwiching the semiconductor substrate together with the first straight lines, and the light-receiving-surface lead connection electrodes are intermittently formed on the first straight lines such that positions where the light-receiving-surface lead connection electrodes are opposite to the back-surface lead connection electrodes while sandwiching the semiconductor substrate are missing.

Furthermore, a solar battery cell according to another aspect of the present invention is constructed in such a manner as to include a plurality of grid electrodes that are formed in parallel and light-receiving-surface lead connection electrodes that are formed while extending on first straight lines that are substantially orthogonal to the grid electrodes and are connected to light-receiving-surface lead wires, on a light receiving surface of a semiconductor substrate, and include back-surface lead connection electrodes that are connected to back-surface lead wires, on a back surface of the semiconductor substrate, wherein the back-surface lead connection electrodes are formed in a dot shape at a predetermined distance therebetween on second straight lines that are substantially opposite to the first straight lines while sandwiching the semiconductor substrate together with the first straight lines, and a width of each of the light-receiving-surface lead connection electrodes at a position where the light-receiving-surface lead connection electrode is opposite to each of the back-surface lead connection electrodes is larger than a width of the light-receiving-surface lead connection electrode at a position where the light-receiving-surface lead connection electrode is not opposite to the back-surface lead connection electrode, and is also larger than a width of each of the light-receiving-surface lead wires.

ADVANTAGEOUS EFFECTS OF INVENTION

According to the solar battery cell of the first invention of the present invention, back-surface lead connection electrodes are formed in a dot shape at a predetermined distance therebetween on second straight lines that are substantially opposite to first straight lines while sandwiching a semiconductor substrate together with the first straight lines, and light-receiving-surface lead connection electrodes are intermittently formed on the first straight lines such that positions where the light-receiving-surface lead connection electrodes are opposite to the back-surface lead connection electrodes while sandwiching the semiconductor substrate are missing. Therefore, concentration of stress that occurs when the light-receiving-surface lead connection electrodes are overlapped with the back-surface lead connection electrodes can be relaxed. Further, stress that occurs at an edge portion of the light-receiving-surface lead connection electrodes when light-receiving-surface lead wires stick out from these electrodes is not overlapped with stress that occurs at an edge portion of the back-surface lead connection electrodes when these electrodes stick out from back-surface lead wires. Because concentration of stress that occurs when the lead wires stick out from the lead connection electrodes can be relaxed, occurrence of breakage of cells can be decreased by suppressing local excessive deformation.

According to the solar battery cell of the second invention of the present invention, back-surface lead connection electrodes are formed in a dot shape at a predetermined distance therebetween on second straight lines that are substantially opposite to first straight lines while sandwiching a semiconductor substrate together with the first straight lines. The width of each of light-receiving-surface lead connection electrodes at a position where the electrode is opposite to the back-surface lead connection electrode is larger than the width of the light-receiving-surface lead connection electrode at a position where the electrode is not opposite to the back-surface lead connection electrode, and is also larger than the width of each of light-receiving-surface lead wires. Therefore, the light-receiving-surface lead wires do not stick out from the light-receiving-surface lead connection electrodes. When back-surface lead wires stick out from the back-surface lead connection electrodes, stress that occurs at an edge portion thereof is not overlapped. Concentration of stress relative to stress that occurs when lead wires stick out from the lead connection electrodes can be relaxed. Therefore, occurrence of breakage of cells can be decreased by suppressing local excessive deformation. At the same time, only the width of each of light-receiving-surface lead connection electrodes at a position where the electrode is opposite to the back-surface lead connection electrode is set larger than the width of the light-receiving-surface lead connection electrode at a position where the electrode is not opposite to the back-surface lead connection electrode, and the total width of the light-receiving-surface lead connection electrodes is not increased. Therefore, cost increase can be suppressed.

DESCRIPTION OF EMBODIMENTS

Exemplary embodiments of a solar battery cell according to the present invention will be explained below in detail with reference to the accompanying drawings. In the following embodiments, it is explained as an example that a semiconductor substrate is a silicon substrate, light-receiving-surface lead connection electrodes are bus bar electrodes, lead wires are tab wires, and back-surface lead connection electrodes are silver electrodes. The present invention is not limited by these embodiments.

First Embodiment

Figure 1:
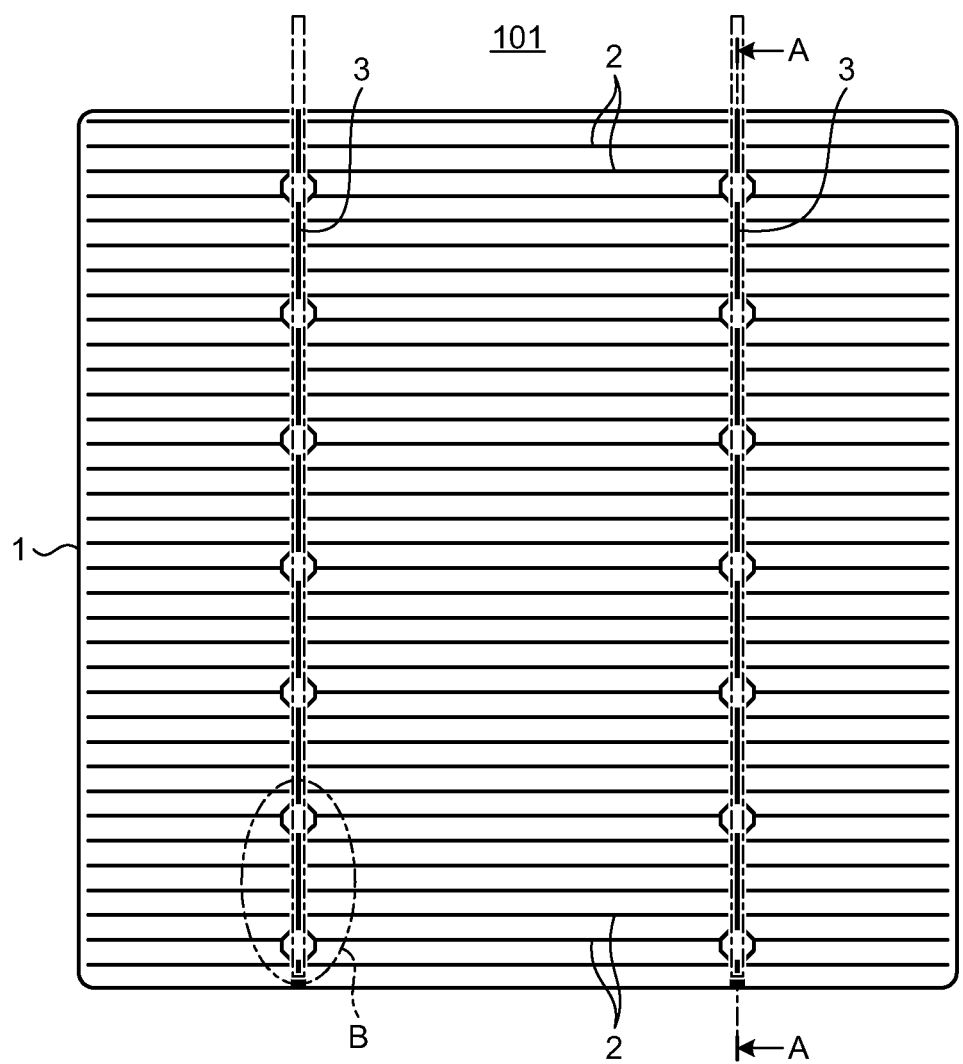
FIG. 1 is a plan view of a light-receiving surface side of a solar battery cell according to a first embodiment of the present invention.
Figure 2:
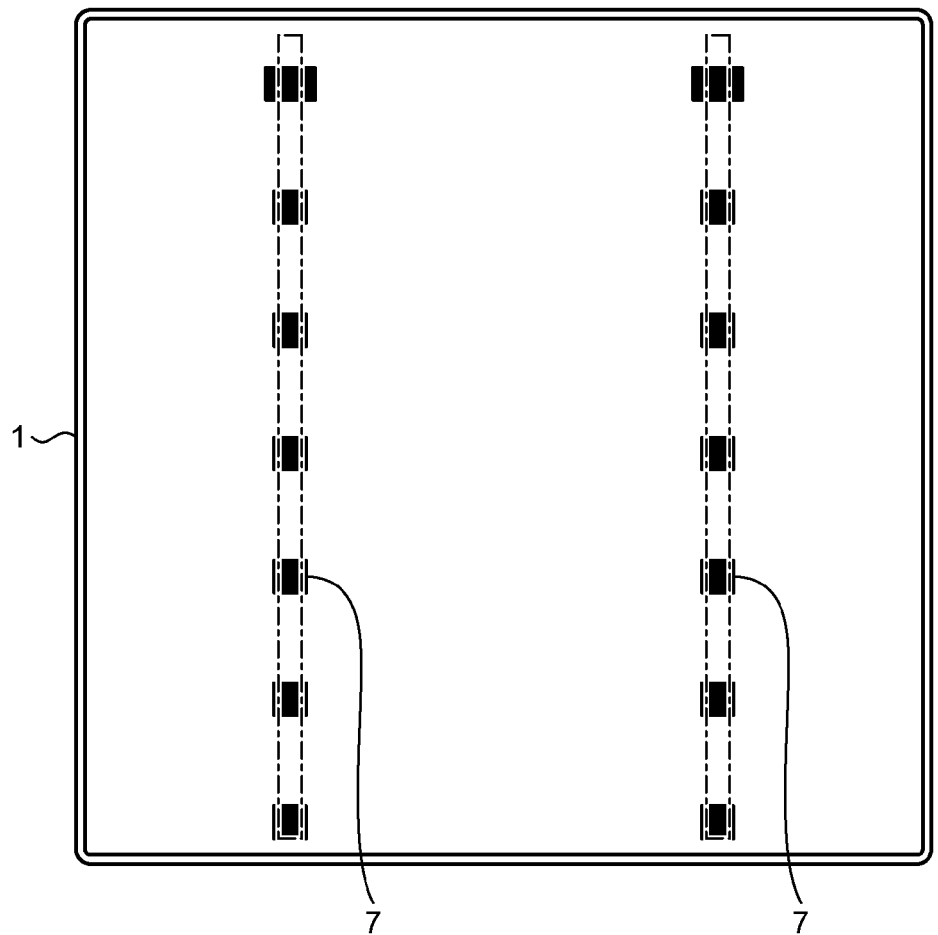
FIG. 2 is a back surface view of FIG. 1.
Figure 3:
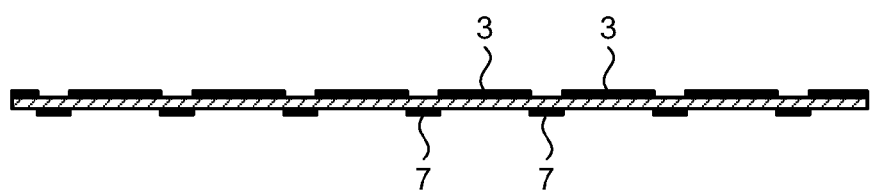
FIG. 3 is a cross-sectional view along a line A-A in FIG. 1.
Figure 4:
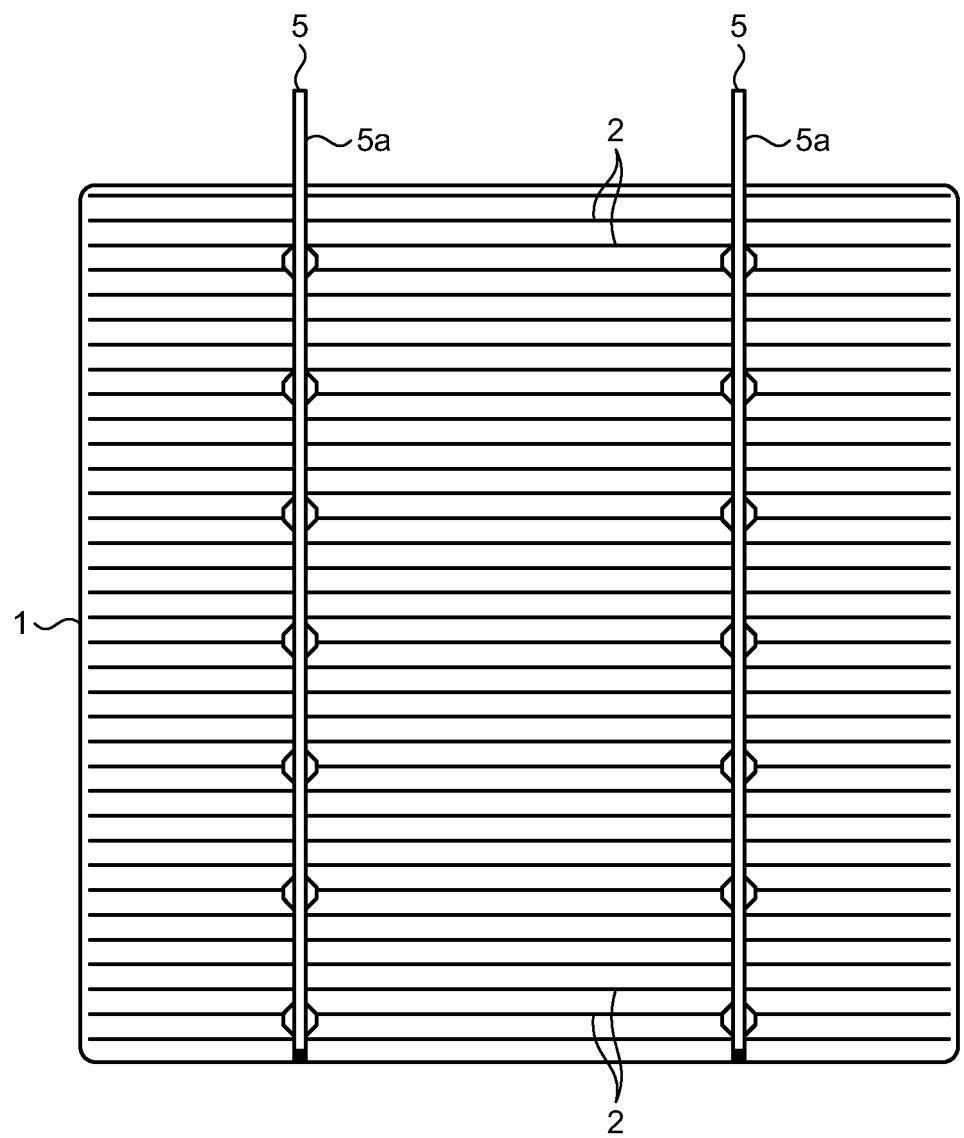
FIG. 4 is a plan view of a state that light-receiving-surface lead wires are connected to light-receiving-surface lead connection electrodes in an overlapped manner.
Figure 5:
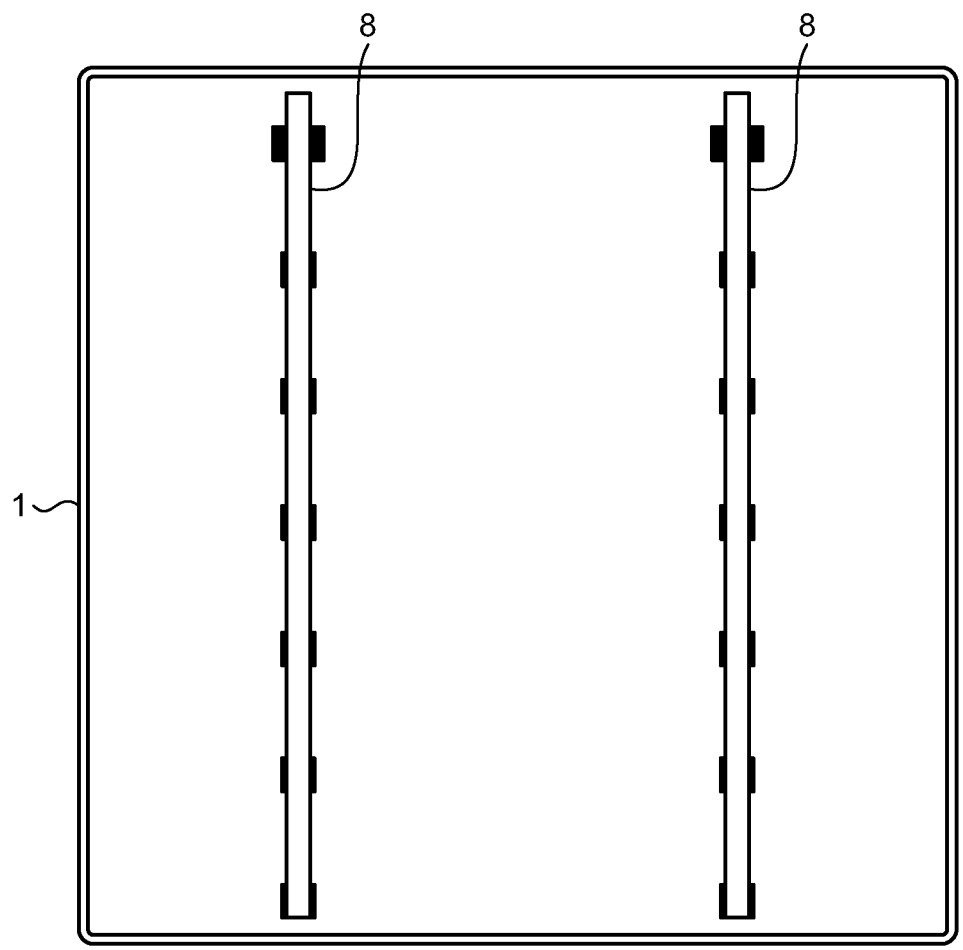
FIG. 5 is a back surface view of a state that back-surface lead wires are connected to back-surface lead connection electrodes in an overlapped manner.
Figure 6:
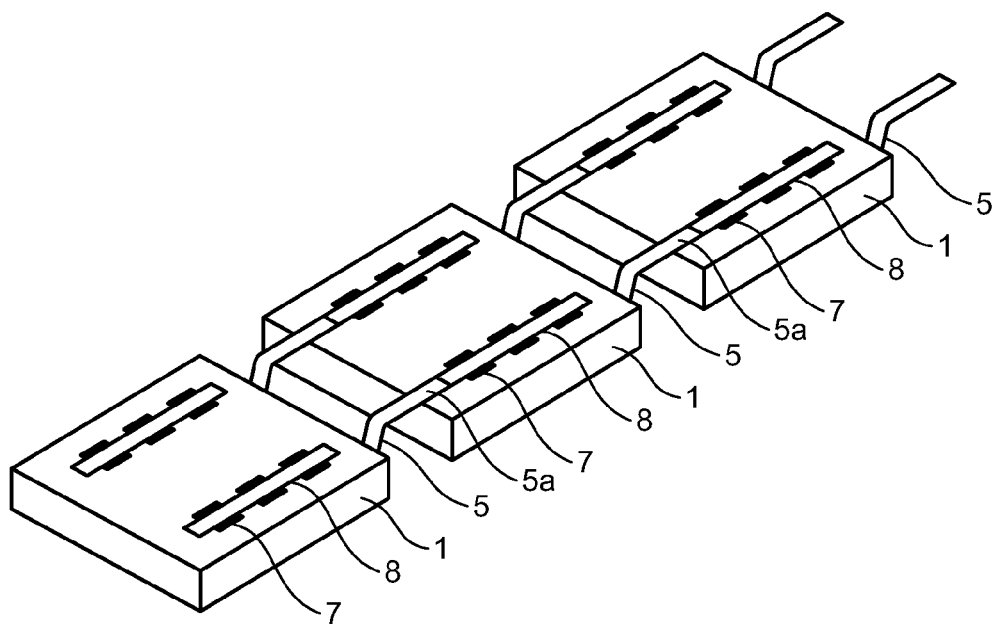
FIG. 6 is a perspective view of a state that light receiving surfaces and back surfaces of a plurality of solar battery cells are connected to each other by lead wires.
Figure 7:
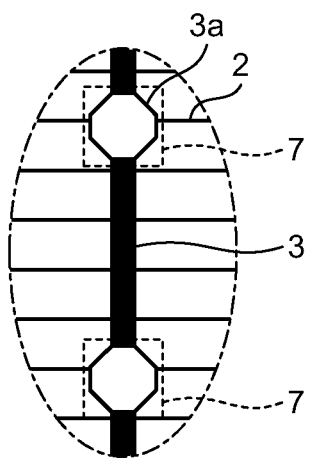
FIG. 7 is an enlarged view of a portion B in FIG. 1.

FIG. 1 is a plan view of a light-receiving surface side of a solar battery cell according to a first embodiment of the present invention. FIG. 2 is a back surface view of FIG. 1. FIG. 3 is a cross-sectional view along a line A-A in FIG. 1. FIG. 4 is a plan view of a state that light-receiving-surface lead wires are connected to light-receiving-surface lead connection electrodes in an overlapped manner. FIG. 5 is a back surface view of a state that back-surface lead wires are connected to back-surface lead connection electrodes in an overlapped manner. FIG. 6 is a perspective view of a state that a plurality of solar battery cells are connected to each other by light-receiving-surface lead wires and back-surface lead wires. FIG. 7 is an enlarged view of a portion B in FIG. 1.

In a solar battery cell 101 according to the present embodiment, plural thin grid electrodes 2 that collect power from the entire surface of the cell while securing a light receiving area as much as possible are arranged substantially in parallel over substantially the entire width of a silicon substrate (semiconductor substrate) 1, at a light receiving surface side of the semiconductor substrate 1. Two bus bar electrodes (light-receiving-surface lead connection electrodes) 3 are provided on straight lines (first straight lines) over substantially the entire length of the semiconductor substrate 1 substantially orthogonal to the grid electrodes 2. Further, as shown in FIG. 4, light-receiving-surface tab wires (light-receiving-surface lead wires) 5 are connected over substantially the entire length of an upper surface of the bus bar electrodes 3 (in FIG.

1, regions where the light-receiving-surface tab wires 5 are overlapped are shown by dashed lines). The width of each of the light-receiving-surface tab wires 5 is the same as or slightly smaller than the width of each of the bus bar electrodes 3. The light-receiving-surface tab wire 5 has extending portions 5a that stick out from a cell surface to connect the silicon substrates 1 in series. The light-receiving-surface tab wires 5 are rectangular copper wires that are generally used for solar-battery lead wires.

Meanwhile, at a back surface side of the silicon substrate 1, plural dot-shaped silver electrodes (back-surface lead connection electrodes) 7 are arranged in two rows at a constant distance between the electrodes. The silver electrodes 7 that are arranged in two rows are provided intermittently at a constant distance on straight lines (second lines) that are opposite to the bus bar electrodes 3. As shown in FIG. 5, on upper surfaces of the silver electrodes 7, back-surface tab wires (back-surface lead wires) 8 are connected over substantially the entire length of the rows (in FIG. 2, regions where the back-surface tab wires 8 are overlapped are shown by dashed lines). The width of each of the back-surface tab wires 8 is smaller than the width of each of the silver electrodes 7. The back-surface tab wires 8 are also rectangular copper wires that are generally used for solar-battery lead wires. In the present embodiment, although the light-receiving-surface tab wires 5 and the back-surface tab wires 8 are made of separate members, these wires can be a continuous tab wire (lead wire).

As shown in FIG. 6, plural silicon substrates 1 are jointly connected in series, by sequentially electrically connecting the extending portions 5a of the light-receiving-surface tab wires 5 to the back-surface tab wires 8 of the adjacent silicon substrate 1, the extending portions 5a entering a back surface side of adjacent silicon substrate 1 from a light receiving surface side. FIG. 6 is a perspective view in which the back surface of the semiconductor substrates 1 is made upward such that connection positions between the light-receiving-surface tab wires 5 and the back-surface tab wires 8 are viewable.

In the solar battery cell 101 according to the present embodiment, as shown in FIGS. 1 and 3, the bus bar electrodes 3 are intermittently formed such that portions where the silver electrodes 7 are present at the back surface side of the silicon substrate 1 are missing. That is, in the solar battery cell 101 according to the present embodiment, the bus bar electrodes 3 and the silver electrodes 7 are not present at positions where they are opposite to each other while sandwiching the silicon substrate 1. In FIGS. 1 to 3, to clearly identify positions where the bus bar electrodes 3 and the silver electrodes 7 are present, the bus bar electrodes 3 and the silver electrodes 7 are represented by filling these electrodes in black.

As shown in FIG. 7, to connect the grid electrodes 2 that extend to portions where the bus bar electrodes 3 are missing to the bus bar electrodes 3, bypass portions 3a are provided between adjacent bus bar electrodes 3. The bypass portions 3a are made of thin paths that are the same as the grid electrodes 2 and are formed by bypassing missing positions, and connect end portions that are opposite to missing portions of the bus bar electrodes 3 and the grid electrodes 2.

Figure 8:
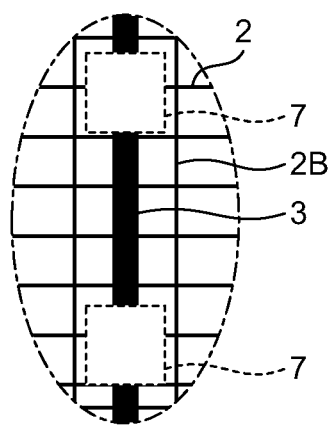
FIG. 8 is an enlarged view corresponding to FIG. 7 and for explaining an example where a second grid electrode is provided with regard to connection of grid electrodes that extend to portions where light-receiving-surface lead connection electrodes are missing.

With regard to connection of the grid electrodes 2 that extend to portions where the bus bar electrodes 3 are missing, a second grid electrode 2B can be also provided as shown in FIG. 8. The second grid electrode 2B is formed orthogonally to the grid electrodes 2, and connects plural grid electrodes 2.

As described above, the solar battery cell 101 according to the present embodiment has plural grid electrodes 2 that are formed in parallel and the bus bar electrodes 3 that extend on the first straight lines that are orthogonal to the grid electrodes 2 and are connected to the light-receiving-surface tab wires 5, on a light receiving surface of the silicon substrate 1, and also has the silver electrodes 7 that are connected to the back-surface tab wires 8, on the back surface of the silicon substrate 1. The silver electrodes 7 are formed in a dot shape at a predetermined distance therebetween on the second straight lines that are opposite to the first straight lines while sandwiching the silicon substrate 1 together with the first straight lines, and the bus bar electrodes 3 are intermittently formed on the first straight lines such that positions that are opposite to the silver electrodes 7 while sandwiching the silicon substrate 1 are missing. With this arrangement, positions where the bus bar electrodes 3 are overlapped with the silver electrodes 7 while sandwiching the silicon substrate 1 are not present. Therefore, the problem of concentration of stress that occurs when the bus bar electrodes 3 are overlapped with the silver electrodes 7 can be relaxed. Further, stress that occurs at an edge portion of the bus bar electrodes 3 if the light-receiving-surface tab wires 5 should stick out from the bus bar electrodes 3 is not overlapped with stress that occurs at an edge portion of the silver electrodes 7 if the back-surface tab wires 8 should stick out from the silver electrodes 7. Because the concentration of stress can be relaxed, occurrence of breakage of cells can be decreased by suppressing local excessive deformation.

Second Embodiment

Figure 9:
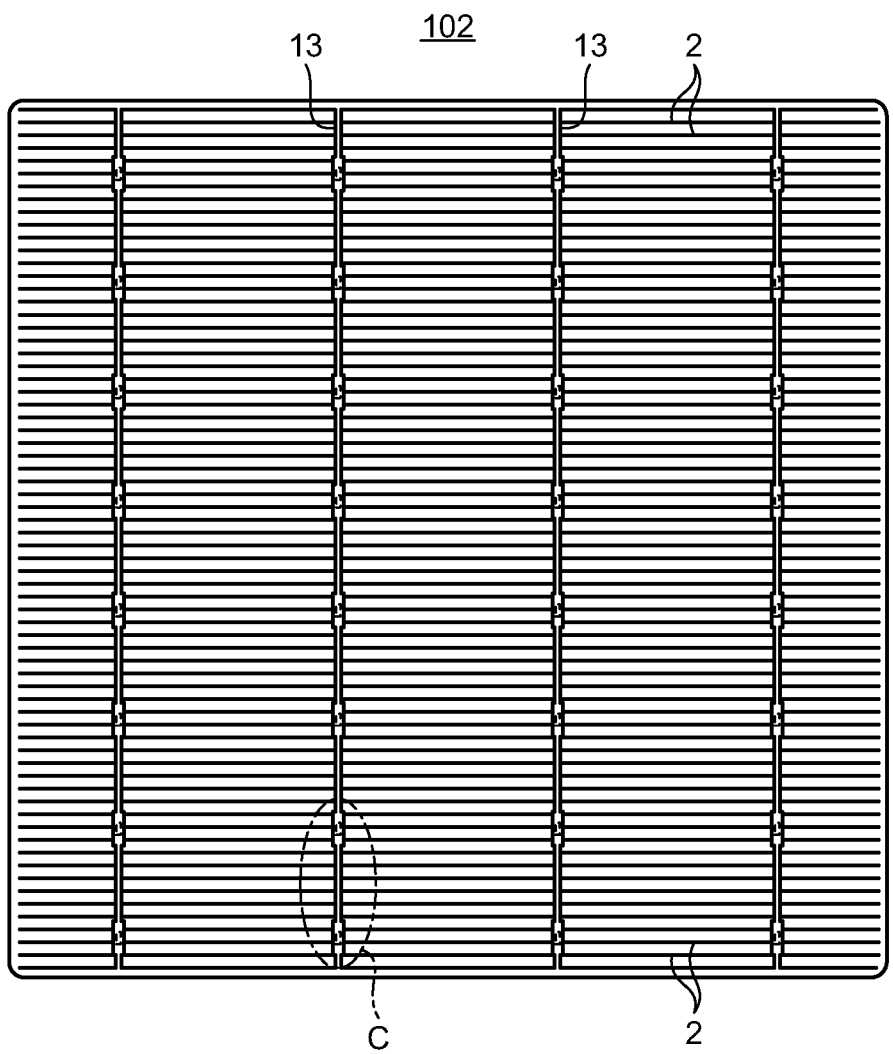
FIG. 9 is a plan view of a light-receiving surface side of a solar battery cell according to a second embodiment of the present invention.
Figure 10:
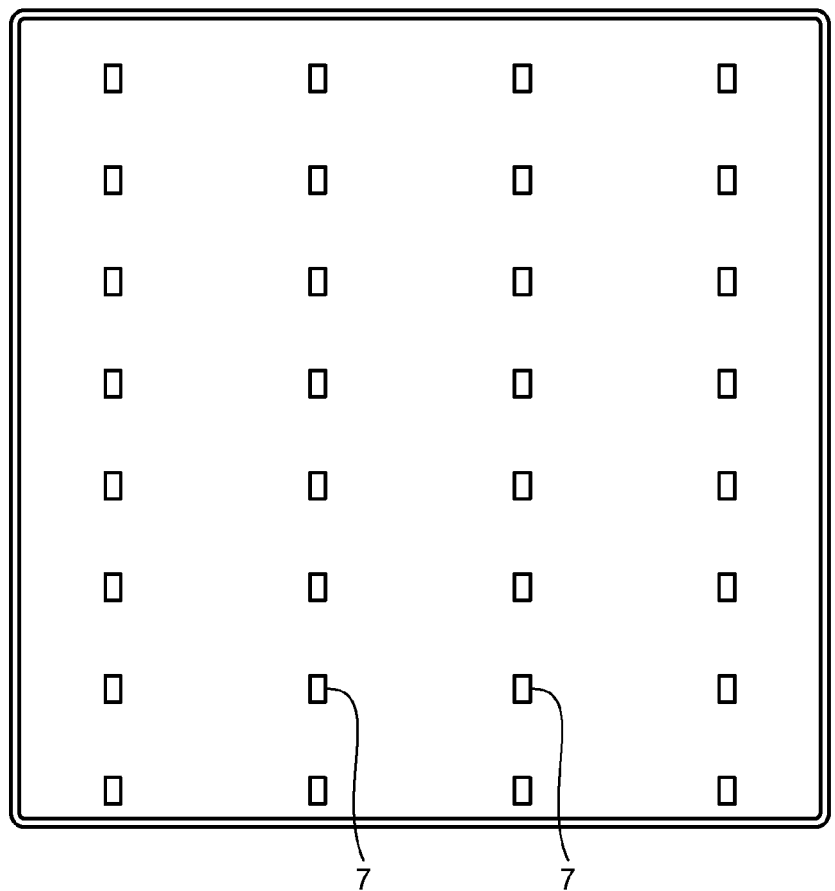
FIG. 10 is a back surface view of FIG. 9.
Figure 11:
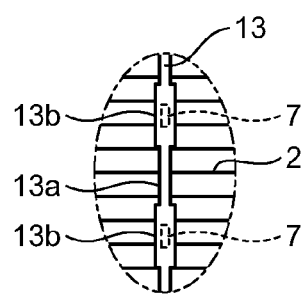
FIG. 11 is an enlarged view of a portion C in FIG. 9.

FIG. 9 is a plan view of a light-receiving surface side of a solar battery cell according to a second embodiment of the present invention. FIG. 10 is a back surface view of FIG. 9. FIG. 11 is an enlarged view of a portion C in FIG. 9. In a solar battery cell 102 according to the present embodiment, four bus bar electrodes (light-receiving-surface lead connection electrodes) 13 are provided on straight lines (first straight lines) over substantially the entire length of a silicon substrate. The light-receiving-surface tab wires 5 (not shown) are also connected over substantially the entire length of an upper surface of the bus bar electrodes 13, in a similar manner to that in the first embodiment.

At a back surface side of the silicon substrate, plural dot-shaped silver electrodes (back-surface lead connection electrodes) 7 are arranged in four rows at a constant distance between the electrodes. The silver electrodes 7 that are arranged in four rows are provided intermittently at a constant distance between the electrodes on straight lines (second lines) that are opposite to the bus bar electrodes 13. On upper surfaces of the silver electrodes 7, the back-surface tab wires 8 (not shown) are connected over substantially the entire length of the rows, in a similar manner to that in the first embodiment.

In the solar battery cell 102 according to the present embodiment, the width of the bus bar electrode 13 at a position 13b where the bus bar electrode 13 is opposite to the silver electrodes 7 is larger than the width of the bus bar electrode 13 at a position 13a where the bus bar electrode 13 is not opposite to the silver electrodes 7, and is also larger than the width of each of the light-receiving-surface tab wires 5. Therefore, it can be arranged such that an edge portion of each of the bus bar electrodes 13 in a width direction is not overlapped with an edge portion of each of the silver electrodes 7 in a width direction. Accordingly, the light-receiving-surface tab wires 5 do not stick out from the bus bar electrodes 13, and thus stress that occurs at an edge portion of the back-surface tab wires 8 when the silver electrodes 7 stick out from the back-surface tab wires 8 is not overlapped. The concentration of stress relative to stress that occurs when the connection electrodes stick out from the tab wires can be relaxed. Therefore, occurrence of breakage of cells can be decreased by suppressing local excessive deformation. Further, only the width of each of the bus bar electrodes 13 at the position 13b where the bus bar electrode 13 is opposite to the silver electrodes 7 is set larger than the width of the bus bar electrode 13 at the position 13a where the bus bar electrode 13 is not opposite to the silver electrodes 7, and the total width of the bus bar electrodes 13 is not increased. Therefore, the material for the electrodes does not increase considerably, and thus cost increase can be suppressed.

Further, the length in an extension direction of each of the bus bar electrodes 13 at the position 13b where the bus bar electrode 13 is opposite to the silver electrodes 7 is larger than the length of each of the silver electrodes 7 in an extension direction of the bus bar electrode 13. Therefore, edge portions are not overlapped in a length direction either. An effect identical to that described above can be also obtained with regard to a length direction.

Industrial Applicability

As described above, the solar battery cell according to the present invention can be suitably applied to a solar battery cell that has grid electrodes and light-receiving-surface connection electrodes on a light receiving surface and has back-surface lead connection electrodes. Particularly, application of the solar battery cell according to the present invention is most suitable to a solar battery cell in which back-surface lead connection electrodes are formed in a dot shape at a predetermined distance therebetween.

Reference Signs List

1 SILICON SUBSTRATE (SEMICONDUCTOR SUBSTRATE)
2 GRID ELECTRODE
2B SECOND GRID ELECTRODE
3, 13 BUS BAR ELECTRODE (LIGHT-RECEIVING-SURFACE LEAD CONNECTION ELECTODE)
3a BYPASS PORTION
5 LIGHT-RECEIVING-SURFACE TAB WIRE (LIGHT-RECEIVING-SURFACE LEAD WIRE)
5a EXTENDING PORTION
7 SILVER ELECTRODE (BACK-SURFACE LEAD CONNECTION ELECTRODE)
8 BACK-SURFACE TAB WIRE (BACK-SURFACE LEAD WIRE)
13a POSITION WHERE BUS BAR ELECTRODE IS NOT OPPOSITE TO SILVER ELECTRODE
13b POSITION WHERE BUS BAR ELECTRODE IS OPPOSITE TO SILVER ELECTRODE
101, 102 SOLAR BATTERY CELL

The invention claimed is:

1. A solar battery cell that comprises a plurality of grid electrodes that are formed in parallel and light-receiving-surface lead connection electrodes extending longitudinally on first straight lines that are substantially orthogonal to the grid electrodes and are connected to light-receiving-surface lead wires, the light-receiving-surface lead connection electrodes extending only on a light receiving surface of a semiconductor substrate without protruding beyond the light receiving surface, each light-receiving-surface lead connection electrode having, in a width direction, an outermost longitudinal edge on one side of the each light-receiving-surface lead connection electrode and an opposite outermost longitudinal edge on the opposite side of the each light-receiving-surface lead connection electrode, the outermost longitudinal edge and the opposite outermost edge being spaced equidistant from a longitudinal centerline of the each light-receiving-surface lead connection electrode, the longitudinal centerline passing longitudinally through the each light-receiving-surface lead connection electrode, and the solar battery cell comprises a plurality of back-surface lead connection electrodes that are connected to back-surface lead wires, formed on second straight lines that are substantially opposite to the first straight lines while sandwiching the semiconductor substrate together with the first straight lines, on a back surface of the semiconductor substrate, wherein a width of each one of the light-receiving-surface lead connection electrodes at a position where one light-receiving-surface lead connection electrode is opposite to one of the back-surface lead connection electrodes is larger than a width of the one light-receiving-surface lead connection electrode at a position where the one light-receiving-surface lead connection electrode is not opposite to the one back-surface lead connection electrode, and an edge portion of each of the light-receiving-surface lead connection electrodes is not overlapped with an edge portion of each of the back-surface lead connection electrodes in the width direction, the width being, in the width direction, from the outermost longitudinal edge of the one light-receiving-surface lead connection electrode to the opposite outermost longitudinal edge of the one light-receiving-surface lead connection electrode.

2. The solar battery cell according to claim 1, wherein a length in an extension direction of each one of the light-receiving-surface lead connection electrodes at a position where one light-receiving-surface lead connection electrode is opposite to one of the back-surface lead connection electrodes is larger than a length of the one back-surface lead connection electrode in an extension direction of the one light-receiving-surface lead connection electrode.

3. A solar battery cell that comprises a plurality of grid electrodes that are formed in parallel and light-receiving-surface lead connection electrodes extending longitudinally on first straight lines that are substantially orthogonal to the grid electrodes and are connected to light-receiving-surface lead wires, on a light receiving surface of a semiconductor substrate, each light-receiving-surface lead connection electrode having, in a width direction, an outermost longitudinal edge on one side of the each light-receiving-surface lead connection electrode and an opposite outermost longitudinal edge on the opposite side of the each light-receiving-surface lead connection electrode, the outermost longitudinal edge and the opposite outermost edge being spaced equidistant from a longitudinal centerline of the each light-receiving-surface lead connection electrode, the longitudinal centerline passing longitudinally through the each light-receiving-surface lead connection electrode, and the solar battery cell comprises a plurality of back-surface lead connection electrodes that are connected to back-surface lead wires, formed on second straight lines that are substantially opposite to the first straight lines while sandwiching the semiconductor substrate together with the first straight lines, on a back surface of the semiconductor substrate, wherein a width of each one of the light-receiving-surface lead connection electrodes at a position where one light-receiving-surface lead connection electrode is opposite to one of the back-surface lead connection electrodes is larger than a width of the one light-receiving-surface lead connection electrode at a position where the one light-receiving-surface lead connection electrode is not opposite to the one back-surface lead connection electrode, and an edge portion of each of the light-receiving-surface lead connection electrodes is not overlapped with an edge portion of each of the back-surface lead connection electrodes in the width direction, the width being, in the width direction, from the outermost longitudinal edge of the one light-receiving-surface lead connection electrode to the opposite outermost longitudinal edge of the one light-receiving-surface lead connection electrode, wherein a width of each one of the light-receiving-surface lead connection electrodes at a position where one light-receiving-surface lead connection electrode is opposite to one of the back-surface lead connection electrodes is larger than a width of each of the light-receiving-surface lead wires.

4. The solar battery cell according to claim 1, wherein a width of each one of the light-receiving-surface lead connection electrodes at a position where one light-receiving-surface lead connection electrode is opposite to one of the back-surface lead connection electrodes is larger than a width of the one back-surface lead connection electrode.

5. The solar battery cell according to claim 1, wherein a width of each one of the light-receiving-surface lead connection electrodes at a position where one light-receiving-surface lead connection electrode is opposite to one of the back-surface lead connection electrodes is larger than a width of each of the light-receiving-surface lead wires.

6. The solar battery cell according to claim 1, wherein the light-receiving-surface lead connection electrodes directly contact the surface of the semiconductor substrate.

* * * * *